United States Patent
Zhu et al.

(10) Patent No.: US 10,665,660 B2
(45) Date of Patent: May 26, 2020

(54) DISPLAY DEVICE, AND METHOD FOR MANUFACTURING THE SAME

(71) Applicant: BOE TECHNOLOGY GROUP CO., LTD., Beijing (CN)

(72) Inventors: Ming Zhu, Beijing (CN); Xue Dong, Beijing (CN); Jikai Yao, Beijing (CN); Guangkui Qin, Beijing (CN); Xinxing Wang, Beijing (CN); Jing Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/556,405

(22) PCT Filed: Jan. 22, 2017

(86) PCT No.: PCT/CN2017/072055
§ 371 (c)(1),
(2) Date: Sep. 7, 2017

(87) PCT Pub. No.: WO2017/190535
PCT Pub. Date: Nov. 9, 2017

(65) Prior Publication Data
US 2019/0115410 A1     Apr. 18, 2019

(30) Foreign Application Priority Data
May 6, 2016 (CN) .......................... 2016 1 0298101

(51) Int. Cl.
*G06F 3/044* (2006.01)
*G06F 3/041* (2006.01)
(Continued)

(52) U.S. Cl.
CPC .......... *H01L 27/3272* (2013.01); *G06F 3/044* (2013.01); *H01L 27/3276* (2013.01);
(Continued)

(58) Field of Classification Search
None
See application file for complete search history.

(56) References Cited

U.S. PATENT DOCUMENTS

2005/0140287 A1* 6/2005 Ko .................... H01L 27/3253
313/506
2010/0309152 A1* 12/2010 Kusuda ............... G02F 1/13338
345/173

(Continued)

FOREIGN PATENT DOCUMENTS

CN            1638579 A       7/2005
CN            1822383 A       8/2006
(Continued)

OTHER PUBLICATIONS

International Search Report and Written Opinion for Application No. PCT/CN2017/072055, dated May 8, 2017, 9 Pages.

*Primary Examiner* — Stephen T. Reed
(74) *Attorney, Agent, or Firm* — Brooks Kushman P.C.

(57) ABSTRACT

A single-side light-emitting source, a method for manufacturing the same, and a display device are provided. The single-side light-emitting source includes a base substrate; a plurality of light-shielding patterns on the base substrate; a signal transmission pattern covering the plurality of light-shielding patterns; a plurality of first electrodes; an electroluminescent layer on the first electrodes; and a transparent second electrode layer on the electroluminescent layer. In the above single-side light-emitting source, the first electrodes are on the signal transmission pattern, and an orthographic projection of each first electrode onto the base substrate is within an orthographic projection of a corresponding light-shielding pattern onto the base substrate.

17 Claims, 4 Drawing Sheets

(51) Int. Cl.
*H01L 27/32* (2006.01)
*H01L 51/52* (2006.01)
*H01L 51/56* (2006.01)

(52) U.S. Cl.
CPC ...... *H01L 51/5209* (2013.01); *H01L 51/5212* (2013.01); *H01L 51/5284* (2013.01); *H01L 51/56* (2013.01); *G06F 3/0412* (2013.01); *G06F 2203/04103* (2013.01); *H01L 51/5218* (2013.01); *H01L 2251/5315* (2013.01); *H01L 2251/5361* (2013.01); *H01L 2251/568* (2013.01)

(56) References Cited

U.S. PATENT DOCUMENTS

| 2017/0062772 | A1  | 3/2017 | Chu et al. | |
| 2017/0154704 | A1* | 6/2017 | Kanna | C09D 129/04 |
| 2017/0186824 | A1* | 6/2017 | Lee | H01L 27/3223 |

FOREIGN PATENT DOCUMENTS

| CN | 105070741 A | 11/2015 |
| CN | 105870134 A | 8/2016 |

\* cited by examiner

DISPLAY DEVICE, AND METHOD FOR MANUFACTURING THE SAME

CROSS-REFERENCE TO RELATED APPLICATION

This application is the U.S. national phase of PCT Application No. PCT/CN2017/072055 filed on Jan. 22, 2017, which claims priority to Chinese Patent Application No. 201610298101.0 filed on May 6, 2016, which are incorporated herein by reference in their entireties.

TECHNICAL FIELD

The present disclosure relates to the field of display technology, and in particular to a single-side light-emitting source, a method for manufacturing the single-side light-emitting source, and a display device.

BACKGROUND

Because a reflective display technique has a good outdoor reading experience and a low power consumption, the reflective display technique increasingly draws attentions in the field of wearable display techniques. However, because an image displayed by a reflective display apparatus may not be seen in a weak ambient-light environment or a dark environment, an application of the reflective display apparatus is restricted to some extent. A front light-source technique may solve the above technical problem. However, it is difficult to arrange an edge light-guide plate above the reflective display apparatus in the related art. In addition, the edge light-guide plate is easy to be smudged, scraped, and thus damaged. Furthermore, the edge light-guide plate may be incompatible with a touch panel. Since the edge light-guide plate emits light from both sides, a contrast of the reflective display apparatus is low in the dark environment.

SUMMARY

An objective of the present disclosure is to provide a front light source for a reflective display apparatus which may increase a contrast of the reflective display apparatus in a dark environment and be compatible with a touch panel.

The above objective of the present disclosure is realized by a single-side light-emitting source and a method for manufacturing the single-side light-emitting source and a display device provided in the present disclosure. The embodiments of the present disclosure provide the following technical solutions.

In one aspect, a single-side light-emitting source is provided in the present disclosure. The single-side light-emitting source includes: a base substrate, a plurality of light-shielding patterns on the base substrate; a signal transmission pattern covering the plurality of light-shielding patterns; a plurality of first electrodes on the signal transmission pattern, wherein an orthographic projection of each of the plurality of first electrodes onto the base substrate is within an orthographic projection of a corresponding one of the plurality light-shielding patterns onto the base substrate; an electroluminescent layer on the plurality of first electrodes; and a transparent second electrode layer on the electroluminescent layer.

Further, the single-side light-emitting source further includes an insulation layer between the adjacent ones of the plurality of first electrodes along a horizontal direction, wherein a first surface of the insulation layer and first surfaces of the plurality of first electrodes are at a same horizontal level, and a second surface of the insulation layer is on the signal transmission pattern.

Further, in the above single-side light-emitting source, the signal transmission pattern is a whole layer and is made of a transparent conductive material.

Further, in the above single-side light-emitting source, a shape of each of the plurality of light-shielding patterns is circular.

Further, in the above single-side light-emitting source, a diameter of each of the plurality of light-shielding patterns is in the range of 20 μm to 60 μm.

Further, in the single-side light-emitting source, each of the plurality of first electrodes includes a metallic pattern; and a transparent conductive pattern located at one side of the metallic pattern facing the electroluminescent layer; wherein a shape of the metallic pattern and a shape of the transparent conductive pattern are identical.

Further, in the single-side light-emitting source, the metallic pattern is made of Ag or Al, and the transparent conductive pattern is made of indium tin oxide.

Further, in the above single-side light-emitting source, the second electrode layer is made of indium zinc oxide.

Further, the single-side light-emitting source further includes a driving circuit configured to provide the plurality of first electrodes and the second electrode layer with corresponding electrical signals.

Further, in the above single-side light-emitting source, a size of each of the plurality of first electrodes increases gradually along a direction from a side edge of the base substrate where the base substrate is connected to the driving circuit to a center of the base substrate.

Further, in the single-side light-emitting source, a thickness of the signal transmission pattern is in the range of 1300 μm to 1400 μm.

Further, in the single-side light-emitting source, a shape of each of the plurality of light-shielding patterns is one of rectangle, ellipse or trapezoid.

Further, in the single-side light-emitting source, a thickness of the transparent conductive pattern is in the range of 100 Å to 140 Å.

Further, in the single-side light-emitting source, a diameter of the metallic pattern is 5 μm to 7 μm smaller than the diameter of a corresponding one of the plurality of light-shielding patterns.

Further, the single-side light-emitting source further includes an encapsulation layer covering the second electrode layer.

In a second aspect, a display device is further provided, which includes: a reflective display panel, and the above single-side light-emitting source attached at a light-emitting side of the reflective display panel, wherein a light-emitting side of the single-side light-emitting source faces the reflective display panel.

Further, the display device further includes a touch screen above the single-side light-emitting source.

Optionally, in the above display device, a base substrate of the single-side light-emitting source is reused as a touch screen of the display device.

In a third aspect, the embodiments of the present disclosure further provide a method for manufacturing the single-side light-emitting source, the method includes: providing a base substrate; forming a plurality of light-shielding patterns on the base substrate; forming a signal transmission pattern covering the plurality of light-shielding patterns; forming a plurality of first electrodes on the signal transmission pattern, wherein an orthographic projection of each of the plurality of first electrodes onto the base substrate is within an orthographic projection of a corresponding one of the plurality of light-shielding patterns onto the base substrate; forming an insulation layer; forming an electroluminescent layer on the plurality of first electrodes; and forming a transparent second electrode layer on the electroluminescent layer.

Further, forming the plurality of first electrodes on the signal transmission pattern includes: depositing sequentially a metallic layer and a transparent conductive layer on the base substrate on which the signal transmission pattern has been formed; coating a photoresist onto the transparent conductive layer, and exposing the photoresist by means of a first mask plate, wherein the first mask plate comprises a plurality of light-shielding regions corresponding to positions of the plurality of first electrodes and a light-transmitting region other than the plurality of light-shielding regions; developing the photoresist to form a plurality of photoresist-reserved regions and a photoresist-removed region, wherein the plurality of photoresist-reserved regions correspond to the positions of the plurality of first electrodes; etching the metallic layer and the transparent conductive layer at the photoresist-removed region off; and removing the photoresist at the plurality of photoresist-reserved regions, to form a metallic pattern and a transparent conductive pattern.

Optionally, forming the plurality of first electrodes on the signal transmission pattern includes: sputtering or evaporating, by means of a second mask plate, a metallic material onto the base substrate on which the signal transmission pattern has been formed, to form the metallic pattern, wherein the second mask plate comprises opening regions corresponding to the positions of the plurality of first electrodes; sputtering or evaporating, by means of the second mask plate, a transparent conductive material onto the metallic pattern, to form a transparent conductive pattern.

Further, forming the transparent second electrode layer on the electroluminescent layer includes forming the transparent second electrode layer onto the electroluminescent layer by a low-temperature deposition process.

Further, in the above method for manufacturing the single-side light-emitting source in the present disclosure, the insulation layer is located between adjacent ones of the plurality of the first electrodes along a horizontal direction, and an upper surface of the insulation layer and an upper surface of each of the plurality of first electrodes are at a same horizontal level.

Further, the above method for manufacturing the single-side light-emitting source in the present disclosure further includes forming an encapsulation layer on the second electrode layer.

In the above solution, the single-side light-emitting source emits light only from one side of the second electrode layer. Therefore, when the single-side light-emitting source is attached onto the reflective display panel and turned on in the dark environment, the light rays emitted by the single-side light-emitting source enter the reflective display panel and then be reflected out and into the human eyes, thereby realizing the display. Because the single-side light-emitting source emits light only from one side of the single-side light-emitting source facing the reflective display panel, the display contrast in the dark environment may be increased. In addition, in the bright environment, the single-side light-emitting source may be turned off, and the ambient light may enter the reflective display panel and then be reflected out and into the human eyes, thereby realizing the display. Therefore, the single-side light-emitting source and the display device are characterized in a simple manufacture process, a low cost and repairability.

REFERENCE NUMERALS

1: base substrate; 2: light-shielding pattern; 3: signal transmission pattern; 4: metallic pattern; 5: transparent conductive pattern; 6: insulation layer; 7: electroluminescent layer; 8: second electrode layer; 9: encapsulation layer; 10: reflective display panel; 11: adhesive; 12: single-side light-emitting source; 100: single-side light-emitting source; 400: driving circuit; 600: display device

DETAILED DESCRIPTION

In order to make technical problems, technical solutions and advantages of the present disclosure more clear, the present disclosure will be described hereinafter in details in conjunction with drawings and embodiments.

Directing to the technical problems in the related arts that the reflective display apparatus has the low contrast in the dark environment, the present disclosure provides in some embodiments a single-side light-emitting source, a method for manufacturing the single-side light-emitting source, and a display device, so as to increase the contrast of the display device in the dark environment.

Figure 1:
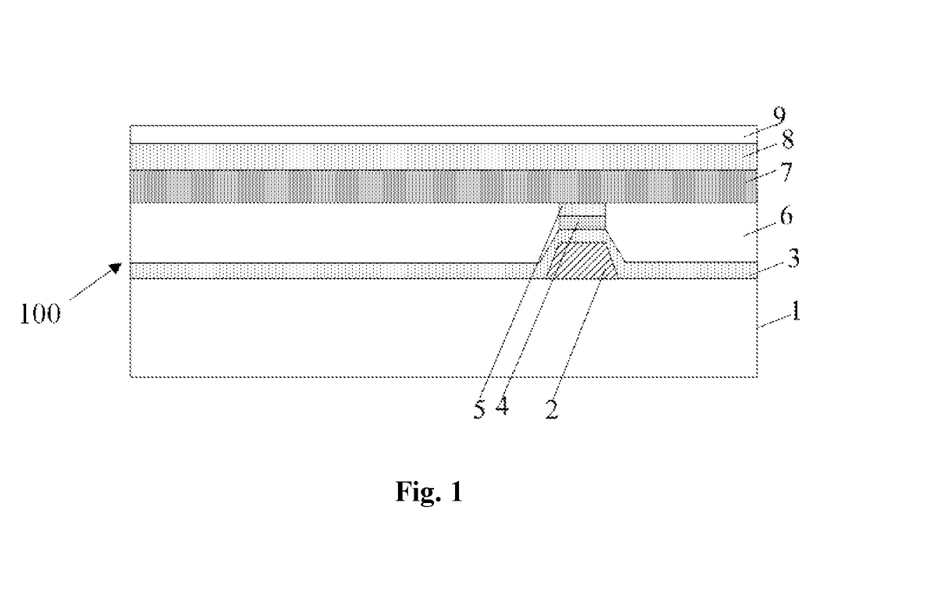
FIG. 1 is a schematic view of a single-side light-emitting source in some embodiments of the present disclosure.

A single-side light-emitting source 100 is provided in some embodiments of the present disclosure. As shown in FIG. 1, the single-side light-emitting source 100 includes: a base substrate 1; a plurality of light-shielding patterns 2 on the base substrate 1; a signal transmission pattern 3 covering the plurality of light-shielding patterns 2; a plurality of first electrodes arranged on and connected to the signal transmission pattern 3, wherein an orthographic projection of each of the plurality of first electrodes on the base substrate 1 completely falls within an orthographic projection of a corresponding one of the plurality of light-shielding patterns 2 on the base substrate 1; an electroluminescent layer 7 on the plurality of first electrodes; and a transparent second electrode layer 8 on the electroluminescent layer 7. The single-side light-emitting source 100 may further include an encapsulation layer 9 covering the second electrode layer 8.

In the embodiments of the present disclosure, when the single-side light-emitting source is attached onto the reflective display panel and is turned on in a dark environment, the turned-on single-side light-emitting source emits light only from one side of the second electrode layer, so that light rays emitted by the single-side light-emitting source may be irradiated into the reflective display panel and then be reflected out and into human eyes, thereby realizing display. Because the single-side light-emitting source emits light only from one side of the single-side light-emitting source facing the reflective display panel, the contrast of the reflective display panel in the dark environment may be increased. In addition, the single-side light-emitting source may be turned off in a bright environment, and the ambient light may enter the reflective display panel and then be reflected out and into the human eyes, thereby realizing display.

Specifically, each of the plurality of first electrodes may be an anode, and the second electrode layer may be a cathode layer.

Figure 4:
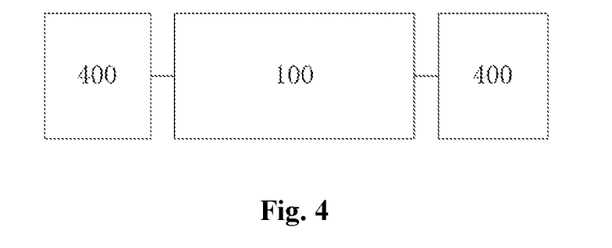
FIG. 4 is a schematic view showing a connection between a single-side light-emitting source and a driving circuit in some embodiments of the present disclosure.

Furthermore, as shown in FIG. 4, the single-side light-emitting source 100 is further connected to at least one driving circuit 400 which is configured to provide the plurality of first electrodes and the second electrode layer 8 with electrical signals. After the at least one driving circuit 400 provides the plurality of first electrodes and the second electrode layer 8 with the electrical signals, electric fields are generated between the second electrode layer 8 and the plurality of first electrodes, and then the electroluminescent layer 7 is driven to emit light. Each of the plurality of first electrodes corresponds to one light-emitting point, the single-side light-emitting source 100 includes a plurality of light-emitting points, and all of light rays emitted by the plurality of light-emitting points are emitted from one side of the second electrode layer 8.

Specifically, as shown in FIG. 1, each of the plurality of first electrodes includes a metallic pattern 4, and a transparent conductive pattern 5 located at one side of the metallic pattern 4 facing the electroluminescent layer 7. The metallic pattern 4 is configured to generate an electric field together with the second electrode layer 8. However, in order to prevent light rays emitted by the electroluminescent layer 7 from being reflected in layers of the single-side light-emitting source 100, the transparent conductive pattern 5 is further arranged on the metallic pattern 4. The transparent conductive pattern 5 is configured to match a cavity length of the electroluminescent layer 7, so as to improve an optical extraction efficiency of the electroluminescent layer 7. Optionally, the metallic pattern 4 is made of metallic materials having a strong-reflectivity, such as Ag, Al, or the like, thereby further improving the optical extraction efficiency of the electroluminescent layer 7. A diameter of the metallic pattern 4 is 5 µm to 7 µm smaller than that of the light-shielding pattern 2. Optionally, the diameter of the metallic pattern 4 is 6 µm smaller than that of the light-shielding pattern 2. The transparent conductive pattern 5 may be made of Indium tin oxide (ITO), and a thickness of the transparent conductive pattern 5 is in the range of 100 Å to 140 Å. Optionally, the thickness of the transparent conductive pattern 5 is 120 Å.

Furthermore, as shown in FIG. 1, the single-side light-emitting source 12 further includes an insulation layer 6 between adjacent ones of the plurality of first electrodes in a horizontal direction. An upper surface of the insulation layer 6 and an upper surface of each of the plurality of first electrodes are located at a same horizontal level, and a lower surface of the insulation layer 6 and a lower surface of the signal transmission pattern 3 are located at a same horizontal level. The insulation layer 6 not only functions as a planarization layer used to provide a flat surface for subsequent processes, but also defines different light-emitting regions. The insulation layer 6 may be made of inorganic insulation materials such as silicon nitride and silicon oxide, or be made of organic insulation materials such as organic resins. In some embodiments of the present disclosure, the electroluminescent layer 7 is a whole layer covering the plurality of first electrodes and the insulation layer 6.

Optionally, the signal transmission pattern 3 is made of transparent conductive materials. The signal transmission pattern 3 may be a whole layer on the base substrate. As a result, a voltage drop during transmitting electrical signals may be reduced, and since the signal transmission pattern 3 is transparent, the single-side light-emitting source 100, when being attached onto the reflective display panel, may not affect ambient lights from entering the reflective display panel. Optionally, the signal transmission pattern 3 may be made of ITO. A thickness of the signal transmission pattern 3 is in the range of 1300 µm to 1400 µm. Optionally, the thickness of the signal transmission pattern 3 is 1350 µm.

Figure 2:
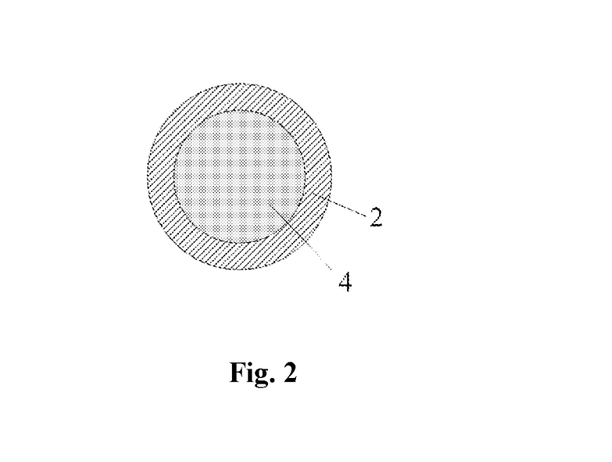
FIG. 2 is a top view of a light-shielding pattern and a first electrode of a single-side light-emitting source in some embodiments of the present disclosure.

In some embodiments of the present disclosure, as shown in FIG. 2, the light-shielding pattern 2 may be configured to have a circular shape. Obviously, the light-shielding pattern 2 may also be configured to have other shapes, e.g., rectangle, elliptic or trapezoidal. In case that the light-shielding pattern 2 is circular, a diameter of the light-shielding pattern 2 may be in the range of 20 µm to 60 µm. If the diameter of the light-shielding pattern 2 is too large (e.g., larger than 60 µm), the light-shielding pattern 2 may be visible by human eyes, and a display effect of a display device may be influenced. If the diameter of the light-shielding pattern 2 is too small (e.g., smaller than 20 µm), the diameter of the metallic pattern 4 also needs be designed to be small. Since an area of a light-emitting region of the single-side light-emitting source is determined by the diameter of the metallic pattern 4, the area of the light-emitting region is also small. As a result, a luminance of the single-side light-emitting source 100 is reduced, and the display effect of the display device may be influenced.

Because the second electrode layer 8 is formed on the electroluminescent layer 7 when manufacturing the single-side light-emitting source 100, the second electrode layer 8 may be made of indium zinc oxide (IZO) which may be formed by a low-temperature deposition process, in order to avoid influencing adversely the electroluminescent layer 7 if the second electrode layer 8 is deposited at a high temperature.

Figure 3:
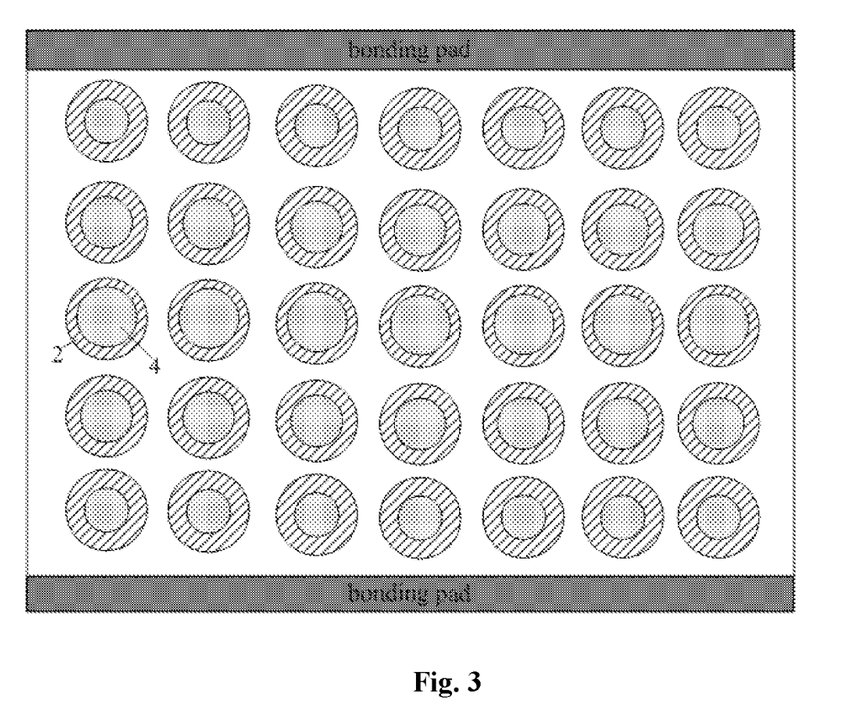
FIG. 3 is a top view of a single-side light-emitting source in some embodiments of the present disclosure.
Figure 5:
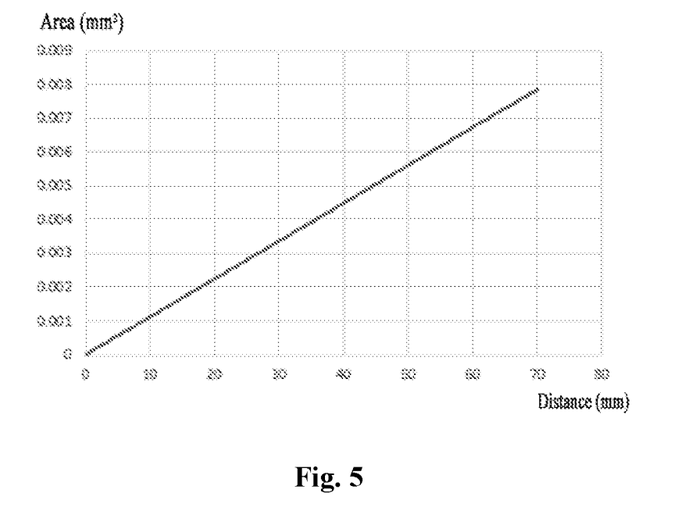
FIG. 5 is a schematic diagram showing a relationship between a distance from a first electrode to a driving circuit and an area of the first electrode in some embodiments of the present disclosure.

In case that a resistance of the signal transmission pattern 3 is large, sizes of the plurality of first electrodes at different positions of the single-side light-emitting source 100 may be configured to be different, in order to compensate a non-uniformity of light emission caused by the voltage drops of the plurality of first electrodes. As shown in FIG. 3, because the shorter a distance from a first electrode to a center of the base substrate 1 is, the larger a distance from the first electrode to a bonding pad (i.e., a distance from the first electrode to the driving circuit 400) is. As shown in FIG. 3, a size of each of the plurality of first electrodes (including the metallic pattern 4 and the transparent conductive pattern 5) may be configured to gradually increase along a direction from a side edge of the base substrate 1 where the bonding pad is located to the center of the base substrate 1. In addition, in order to guarantee display uniformity, an area of the light-shielding pattern 2 may remain unchanged. Specifically, in case that a diameter of the light-shielding pattern 2 is 50 μm, a relationship between the distance from the first electrode to the bonding pad and a light-emitting area of a light-emitting point (i.e., the area of the first electrode) is shown in FIG. 5.

Figure 6:
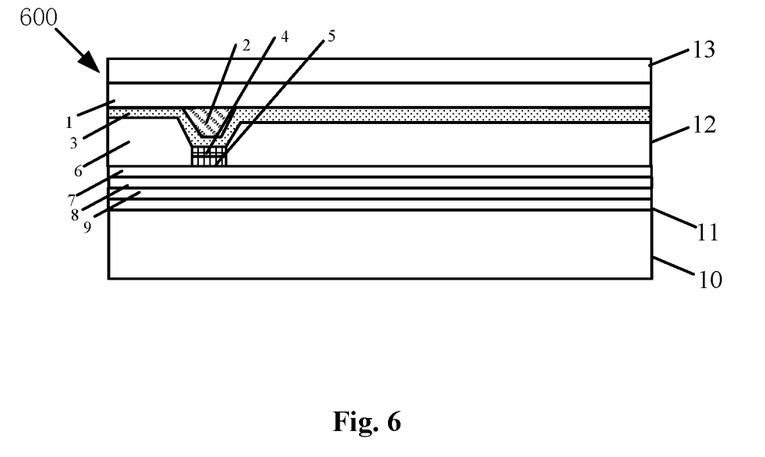
FIG. 6 is a structural schematic view of an example of a display device in some embodiments of the present disclosure.

A display device 600 is further provided in some embodiments of the present disclosure. As shown in FIG. 6, the display device 600 includes a reflective display panel 10 and a single-side light-emitting source 12 attached at a light-emitting side of the reflective display panel 10. The single-side light-emitting source 12 may be the single-side light-emitting source 100 in the above embodiments. The single-side light-emitting source 100 is attached onto the reflective display panel 10 by means of an adhesive 11. The light-emitting side of the single-side light-emitting source 12 faces the reflective display panel 10. The adhesive 11 may be made of a Liquid Optical Clear Adhesive (LOCA) or an Optically Clear Adhesive (OCA). A fashion of the adhesion between the reflective display panel 10 and the single-side light-emitting source 100 may be a full adhesion.

When the single-side light-emitting source in the display device of the present disclosure is turned on in the dark environment after being attached onto the reflective display panel, the single-side light-emitting source emits light only from one side of the single-side light-emitting source. Thus, the light rays emitted by the single-side light-emitting source may enter the reflective display panel and then be reflected out and into human eyes, thereby realizing display. Because the single-side light-emitting source emits light only from one side of the single-side light-emitting source facing the reflective display panel, the display contrast in the dark environment may be increased. In addition, the single-side light-emitting source may be turned off in a bright environment, and the ambient light may enter the reflective display panel and then be reflected out and into the human eyes, thereby realizing the display.

In the display device in the embodiments of the present disclosure, in case that a short circuit occurs at a light-emitting region, an ashing process may be performed to the electroluminescent layer of the light-emitting point at the light-emitting region by means of laser, to form an open circuit at the light-emitting region and repair the light-emitting region by forming a dark spot. The display device may still normally operate after such repairing.

Furthermore, beside the reflective display panel 10 and the single-side light-emitting source 12, the display device 600 of the present disclosure may further include a touch screen 13. The touch screen 13 may be arranged at one side of the single-side light-emitting source 12 away from the reflective display panel 10.

Figure 7:
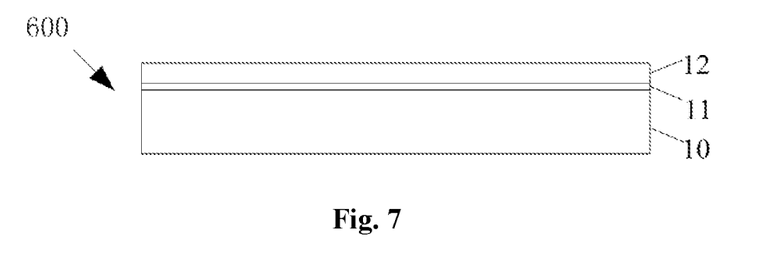
FIG. 7 is a structural schematic view of another example of a display device in some embodiments of the present disclosure.

FIG. 7 is a schematic view of another example of a display device in some embodiments of the present disclosure. The difference between the display device shown in FIG. 6 and the display device shown in FIG. 7 is that the base substrate of the single-side light-emitting source 12 in FIG. 7 is reused as the touch screen of the display device. In this way, the thickness of the display device 600 is reduced.

A method for manufacturing the above single-side light-emitting source is further provided in the present disclosure. The method includes the following steps: providing a base substrate; forming a plurality of light-shielding patterns on the base substrate; forming a signal transmission pattern on the plurality of light-shielding patterns; forming a plurality of first electrodes on the signal transmission pattern, wherein the plurality of first electrodes are connected to the signal transmission pattern and an orthographic projection of each of the plurality of first electrodes on the base substrate is within an orthographic projection of a corresponding one of the plurality of light-shielding patterns on the base substrate; forming an insulation layer; forming an electroluminescent layer on the plurality of first electrodes; and forming a transparent second electrode layer on the electroluminescent layer. The method for manufacturing the above single-side light-emitting source of the present disclosure further includes forming an encapsulation layer on the second electrode layer.

The single-side light-emitting source manufactured according to the embodiments of the present disclosure emits light only from one side of the second electrode layer. Therefore, when the single-side light-emitting source is attached onto the reflective display panel and turned on in the dark environment, the light rays emitted by the single-side light-emitting source enter the reflective display panel and then be reflected out and into the human eyes, thereby realizing the display. Because the single-side light-emitting source emits light only from one side of the single-side light-emitting source facing the reflective display panel, the display contrast in the dark environment may be increased. In addition, in the bright environment, the single-side light-emitting source may be turned off, and the ambient light may enter the reflective display panel and then be reflected out and into the human eyes, thereby realizing the display.

Specifically, each of the plurality of first electrodes may be an anode, and the second electrode layer may be a cathode layer.

Figure 8:
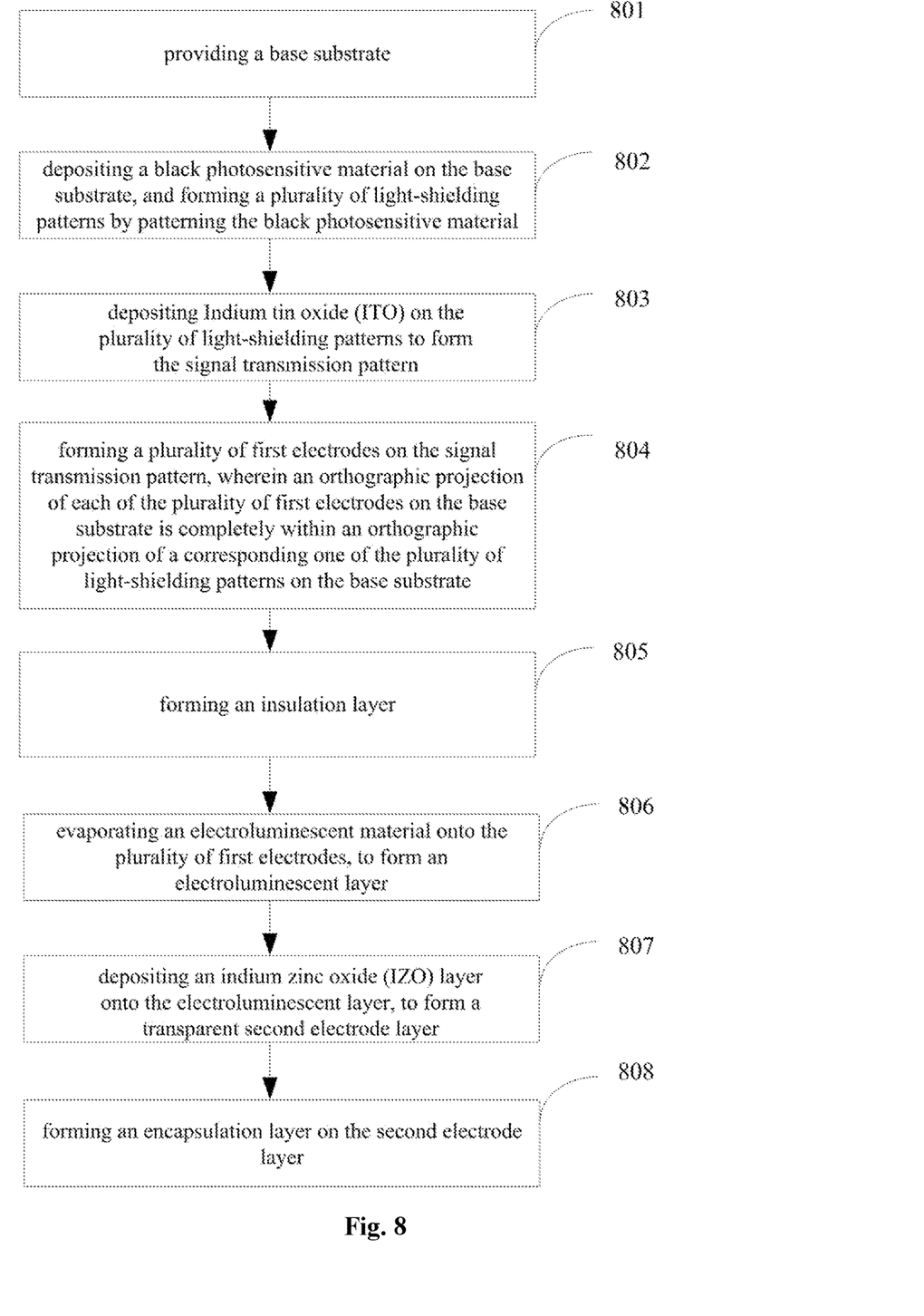
FIG. 8 is a flow chart of a method for manufacturing a single-side light-emitting source in some embodiments of the present disclosure.

As shown in FIG. 8, the method for manufacturing the single-side light-emitting source of the present disclosure may include Step 801 to Step 808.

Step 801: providing a base substrate.

Specifically, the base substrate may be a glass substrate or a quartz substrate.

Step 802: depositing a black photosensitive material on the base substrate, and forming a plurality of light-shielding patterns by patterning the black photosensitive material.

Specifically, a layer of black photosensitive material may be deposited on the base substrate, and then the layer of black photosensitive material may be exposed and developed to form the plurality of light-shielding patterns 2. Shapes of the plurality of light-shielding patterns 2 may be circular, rectangular, elliptic, trapezoidal, or the like. In case that the shape of one light-shielding pattern 2 is circular, a diameter of the light-shielding pattern 2 is optionally in the range of 20 μm to 60 μm. If the diameter of the light-shielding pattern 2 is too large (e.g., larger than 60 μm), the light-shielding pattern 2 may be visual to human eyes, and the display effect of the display device may be influenced adversely. If the diameter of the light-shielding pattern 2 is too small (e.g., smaller than 20 μm), the diameter of the metallic pattern 4 also needs be designed to be small. Since an area of the light-emitting region is determined by the diameter of the metallic pattern 4, the area of the light-emitting region is small correspondingly. As a result, a luminance of the single-side light-emitting source 100 is reduced, and the display effect of the display device may be influenced adversely.

Step 803: depositing Indium tin oxide (ITO) on the plurality of light-shielding patterns to form the signal transmission pattern. The signal transmission pattern is made of ITO. Since the ITO is a transparent conductive material, the signal transmission pattern may be configured to be a whole layer covering the base substrate. On one hand, a voltage drop when transmitting electrical signals may be reduced. On the other hand, since the signal transmission pattern 3 is transparent, the single-side light-emitting source when being attached onto the reflective display panel may not prevent the ambient light from entering the reflective display panel. A thickness of the signal transmission pattern may be in the range of 1300 μm to 1400 μm. Optionally, the thickness of the signal transmission pattern is 1350 μm.

Step 804: forming a plurality of first electrodes on the signal transmission pattern, wherein an orthographic projection of each of the plurality of first electrodes on the base substrate is completely within an orthographic projection of a corresponding one of the plurality of light-shielding patterns on the base substrate.

Specifically, the plurality of first electrodes may be formed by a chemical etching process, or directly formed by a sputtering process or a deposition process.

In case that the plurality of first electrodes are formed by the chemical etching process, a metallic layer and a transparent conductive layer may be deposited sequentially on the base substrate on which the signal transmission pattern has been formed. Then, a photoresist is coated onto the transparent conductive layer and exposed by means of a first mask plate, wherein the first mask plate includes light-shielding regions corresponding to positions of the plurality of first electrodes and a light-transmitting region other than the light-shielding regions. The photoresist is developed to form a plurality of photoresist-reserved regions and a photoresist-removed region, wherein the plurality of photoresist-reserved regions correspond to the positions of the plurality of first electrodes; the metallic layer and the transparent conductive layer in the photoresist-removed region are etched off; and the photoresist in the plurality of photoresist-reserved regions is removed to form the metallic pattern and the transparent conductive pattern, wherein each of the plurality of first electrodes is formed by the metallic pattern and the transparent conductive pattern above the metallic pattern. Specifically, the metallic pattern is made of Ag or Al. For the alignment accuracy, a diameter of the metallic pattern is 5 to 7 μm shorter than the diameter of each light-shielding pattern. Optionally, the diameter of the metallic pattern is 6 μm shorter than the diameter of each light-shielding pattern. The transparent conductive pattern may be made of ITO, and a thickness of the transparent conductive pattern is in the range of 100 Å to 140 Å. Optionally, the thickness of the transparent conductive pattern is 120 Å.

In case that the plurality of first electrodes are directly formed by a sputtering process or a deposition process, the process includes: sputtering or evaporating, by means of a second mask plate, a metallic material onto the base substrate on which the signal transmission pattern has been formed, to form the metallic pattern, wherein the second mask plate includes opening regions corresponding to the positions of the plurality of first electrodes; sputtering or evaporating, by means of the second mask plate, a transparent conductive material onto the metallic pattern, to form a transparent conductive pattern. Specifically, the metallic pattern may be made of metals such s Ag or Al. Due to alignment accuracies, a diameter of the metallic pattern is 5 μm to 7 μm smaller than the diameter of a corresponding one of the plurality of light-shielding patterns. Optionally, the diameter of the metallic pattern is 6 μm smaller than the diameter of the corresponding one of the plurality of light-shielding patterns. The transparent conductive pattern may be made of ITO, and a thickness of the transparent conductive pattern is in the range of 100 Å to 140 Å. Optionally, the thickness of the transparent conductive pattern is 120 Å.

Step 805: forming an insulation layer.

Specifically, an insulation layer is located on an upper surface of the signal transmission pattern and between adjacent ones of the plurality of first electrodes along a horizontal direction, and an upper surface of the insulation layer and an upper surface of each of the plurality of first electrodes are at the same horizontal level. The insulation layer may be made of inorganic insulation materials such as silicon nitride and silicon oxide, or made of an organic insulation material such as organic resin.

Step 806: evaporating an electroluminescent material onto the plurality of first electrodes, to form an electroluminescent layer, wherein the electroluminescent layer may be a whole layer covering the plurality of first electrodes and the insulation layer.

Step 807: depositing an indium zinc oxide (IZO) layer onto the electroluminescent layer, to form a transparent second electrode layer. Since the second electrode layer is formed on the electroluminescent layer when forming the single-side light-emitting source, the second electrode layer may be made of IZO formed by a low-temperature deposition process, in order to prevent the electroluminescent layer from being adversely affected when depositing the second electrode layer at a high temperature.

Step 808: forming an encapsulation layer on the second electrode layer, wherein the encapsulation layer may be made of an inorganic thin film or an organic thin film having a waterproof characteristic and an oxygen proof characteristic, or may be a multi-layer structure formed by multiple inorganic thin films and multiple organic thin films arranged alternately and into a superimposed structure.

Since metallic materials are not used as signal lines of the single-side light-emitting source in the embodiments of the present disclosure, a high aperture ratio design may be implemented. After the single-side light-emitting source is manufactured, the single-side light-emitting source may be attached onto a surface of the reflective display panel by means of Liquid Optical Clear Adhesive (LOCA) or Optically Clear Adhesive (OCA), and the light-emitting side of the single-side light-emitting source faces the reflective display panel. Since the single-side light-emitting source emits light only from one side of the single-side light-emitting source, the single-side light-emitting source, if being turned on in the dark environment after the single-side light-emitting source is attached onto the reflective display panel, emits light rays which enter the reflective display panel and then are reflected out and into the human eyes, thereby realizing the display. Because the single-side light-emitting source emits light only from one side of the single-side light-emitting source facing the reflective display panel, the display contrast in the dark environment may be increased. In addition, in the bright environment, the single-side light-emitting source may be turned off, and the ambient light may enter the reflective display panel and then be reflected out and into the human eyes, thereby realizing the display.

The above are optional embodiments of the present disclosure. A person skilled in the art may make further modifications and improvements without departing from the principle of the present disclosure, and these modifications and improvements shall also fall within the scope of the present disclosure.

What is claimed is:
1. A display device, comprising:
a reflective display panel; and
a single-side light-emitting source, comprising:
a base substrate, a plurality of light-shielding patterns on the base substrate and directly contacting the base substrate, a signal transmission pattern, wherein the signal transparent pattern covers and directly contacts the plurality of light-shielding patterns and the base substrate, a plurality of first electrodes on the signal transmission pattern, wherein each of the plurality of first electrodes comprises a metallic pattern and a transparent conductive pattern on the metallic pattern, an orthographic projection of the metallic pattern on the base substrate is a same as an orthographic projection of the transparent conductive pattern on the base substrate, and an orthographic projection of each of the plurality of first electrodes onto the base substrate is within and overlapped with an orthographic projection of a corresponding one of the plurality light-shielding patterns onto the base substrate, an electroluminescent layer on the plurality of first electrodes, wherein the transparent conductive layer directly contacts the electroluminescent layer, and a transparent second electrode layer on the electroluminescent layer, wherein the transparent second electrode layer is attached to the reflective display panel at a light-emitting side of the reflective display panel.

2. The display device according to claim 1, wherein the display device further comprises a touch screen above the base substrate; or the base substrate is reused as a touch screen of the display device.

3. The display device according to claim 1, wherein an insulation layer is provided between the adjacent ones of the plurality of first electrodes along a horizontal direction, a first surface of the insulation layer and a first surface of the transparent conductive pattern facing away from the metallic pattern are at a same horizontal level, and a second surface of the insulation layer is on the signal transmission pattern and directly contacts the signal transparent pattern, and the signal transmission pattern is a whole layer and is made of a transparent conductive material.

4. The display device according to claim 1, wherein, a shape of each of the plurality of light-shielding patterns is circular, a shape of the metallic pattern and a shape of the transparent conductive pattern are circular and the shape of the metallic pattern is a same as the shape of the transparent conductive pattern, and a diameter of each of the plurality of light-shielding patterns is in the range of 20 µm to 60 µm.

5. The display device according to claim 1, wherein, the metallic pattern is made of Ag or Al, the transparent conductive pattern is made of indium tin oxide, and the second electrode layer is made of indium zinc oxide.

6. The display device according to claim 1, further comprising:

a driving circuit, configured to provide the plurality of first electrodes and the second electrode layer with corresponding electrical signals.

7. The display device according to claim 6, wherein, a size of each of the plurality of first electrodes increases gradually along a direction from a side edge of the base substrate where the base substrate is connected to the driving circuit to a center of the base substrate.

8. The display device according to claim 1, wherein, a thickness of the signal transmission pattern is in the range of 1300 µm to 1400 µm, and a shape of each of the plurality of light-shielding patterns is one of rectangle, ellipse or trapezoid.

9. The display device according to claim 1, wherein, a thickness of the transparent conductive pattern is in the range of 100 Å to 140 Å, and a diameter of the metallic pattern is 5 µm to 7 µm smaller than the diameter of a corresponding one of the plurality of light-shielding patterns.

10. The display device according to claim 1, further comprising:

an encapsulation layer covering the second electrode layer, wherein the encapsulation layer is attached onto the reflective display panel through an adhesive.

11. A method for manufacturing a display device, the method comprising:

providing a base substrate;

forming a plurality of light-shielding patterns on the base substrate and directly contacting the base substrate;

forming a signal transmission pattern covering and directly contacting the plurality of light-shielding patterns and the base substrate;

forming a plurality of first electrodes on the signal transmission pattern, wherein each of the plurality of first electrodes comprises a metallic pattern and a transparent conductive pattern on the metallic pattern, an orthographic projection of the metallic pattern on the base substrate is a same as an orthographic projection of the transparent conductive pattern on the base substrate, an orthographic projection of each of the plurality of first electrodes onto the base substrate is within and overlapped with an orthographic projection of a corresponding one of the plurality of light-shielding patterns onto the base substrate;

forming an insulation layer;

forming an electroluminescent layer on the plurality of first electrodes, wherein the transparent conductive layer directly contact the electroluminescent layer;

forming a transparent second electrode layer on the electroluminescent layer;

providing a reflective display panel; and attaching the transparent second electrode layer to the reflective display panel at a light-emitting side of the reflective display panel.

12. The method according to claim 11, wherein forming the plurality of first electrodes on the signal transmission pattern comprises:

depositing sequentially a metallic layer and a transparent conductive layer on the base substrate on which the signal transmission pattern has been formed;

coating a photoresist onto the transparent conductive layer, and exposing the photoresist by means of a first mask plate, wherein the first mask plate comprises a plurality of light-shielding regions corresponding to positions of the plurality of first electrodes and a light-transmitting region other than the plurality of light-shielding regions;

developing the photoresist to form a plurality of photoresist-reserved regions and a photoresist-removed region, wherein the plurality of photoresist-reserved regions corresponds to the positions of the plurality of first electrodes;

etching the metallic layer and the transparent conductive layer at the photoresist-removed region off; and removing the photoresist at the plurality of photoresist-reserved regions, to form a metallic pattern and a transparent conductive pattern.

13. The method according to claim 11, wherein forming the plurality of first electrodes on the signal transmission pattern comprises:

sputtering or evaporating, by means of a second mask plate, a metallic material onto the base substrate on which the signal transmission pattern has been formed, to form the metallic pattern, wherein the second mask plate comprises opening regions corresponding to the positions of the plurality of first electrodes;

sputtering or evaporating, by means of the second mask plate, a transparent conductive material onto the metallic pattern, to form a transparent conductive pattern.

14. The method according to claim 11, wherein forming the transparent second electrode layer on the electroluminescent layer comprises forming the transparent second electrode layer onto the electroluminescent layer by a low-temperature deposition process.

15. The method according to claim 11, wherein the insulation layer is between adjacent ones of the plurality of the first electrodes along a horizontal direction, and a first surface of the insulation layer and a first surface of the transparent conductive pattern facing away from the metallic pattern are at a same horizontal level, and a second surface of the insulation layer is on the signal transmission pattern and directly contacts the signal transparent pattern, and the signal transmission pattern is a whole layer and is made of a transparent conductive material.

16. The method according to claim 11, wherein before attaching the transparent second electrode layer to the reflective display panel at a light-emitting side of the reflective display panel, the method further comprises forming an encapsulation layer on the second electrode layer.

17. The method according to claim 16, wherein attaching the transparent second electrode layer to the reflective display panel at a light-emitting side of the reflective display panel comprises attaching the encapsulation layer onto the reflective display panel through an adhesive.

* * * * *